(12) United States Patent
Park

(10) Patent No.: US 11,837,134 B1
(45) Date of Patent: Dec. 5, 2023

(54) MULTI-ANGLE DISPLAY DEVICE CONTAINING LENS

(71) Applicant: Hoon Park, Seoul (KR)

(72) Inventor: Hoon Park, Seoul (KR)

( * ) Notice: Subject to any disclaimer, the term of this patent is extended or adjusted under 35 U.S.C. 154(b) by 0 days.

(21) Appl. No.: 17/956,002

(22) Filed: Sep. 29, 2022

(30) Foreign Application Priority Data

Aug. 24, 2022 (KR) .................. 10-2022-0105878

(51) Int. Cl.
  *G09G 3/20* (2006.01)
  *H01L 25/075* (2006.01)
  *H01L 33/58* (2010.01)
  *G09F 19/12* (2006.01)

(52) U.S. Cl.
  CPC ............. *G09G 3/20* (2013.01); *G09G 3/2096* (2013.01); *H01L 25/0753* (2013.01); *H01L 33/58* (2013.01); *G09F 19/125* (2021.05); *G09G 2300/0452* (2013.01)

(58) Field of Classification Search
None
See application file for complete search history.

(56) References Cited

U.S. PATENT DOCUMENTS

2018/0115771 A1* 4/2018 Kwon .................. G09G 3/3233

* cited by examiner

*Primary Examiner* — Ifedayo B Iluyomade
(74) *Attorney, Agent, or Firm* — NKL LAW; Byungwoong Park

(57) ABSTRACT

A multi-angle display device containing a lens. The multi-angle display device containing a lens includes a display panel having a plurality of unit pixels disposed therein; a data driving circuit including a plurality of source drive ICs to drive data lines of the display panel; a gate driving circuit including one or more gate driving ICs to sequentially supply scan pulses to gate lines of the display panel; a timing controller receiving a plurality of timing signals from an external system and generating control signals for controlling operation timings of the data driving circuit and the gate driving circuit; and a lens arranged to be spaced apart from the unit pixel by a predetermined distance, in which the unit pixel includes a plurality of light sources.

5 Claims, 4 Drawing Sheets

[FIG.1]
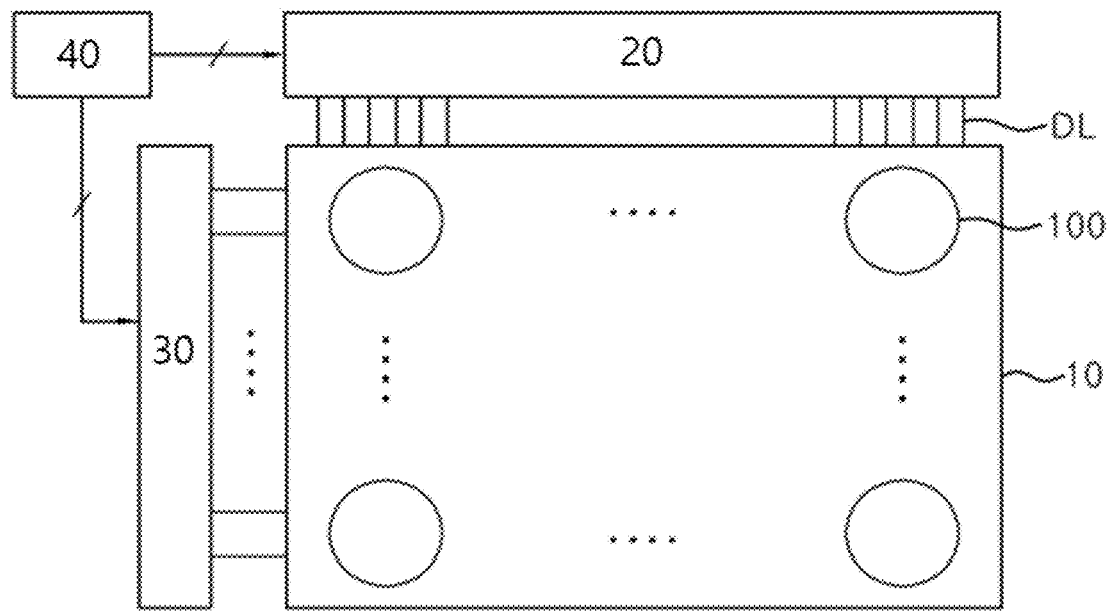
[FIG.2]
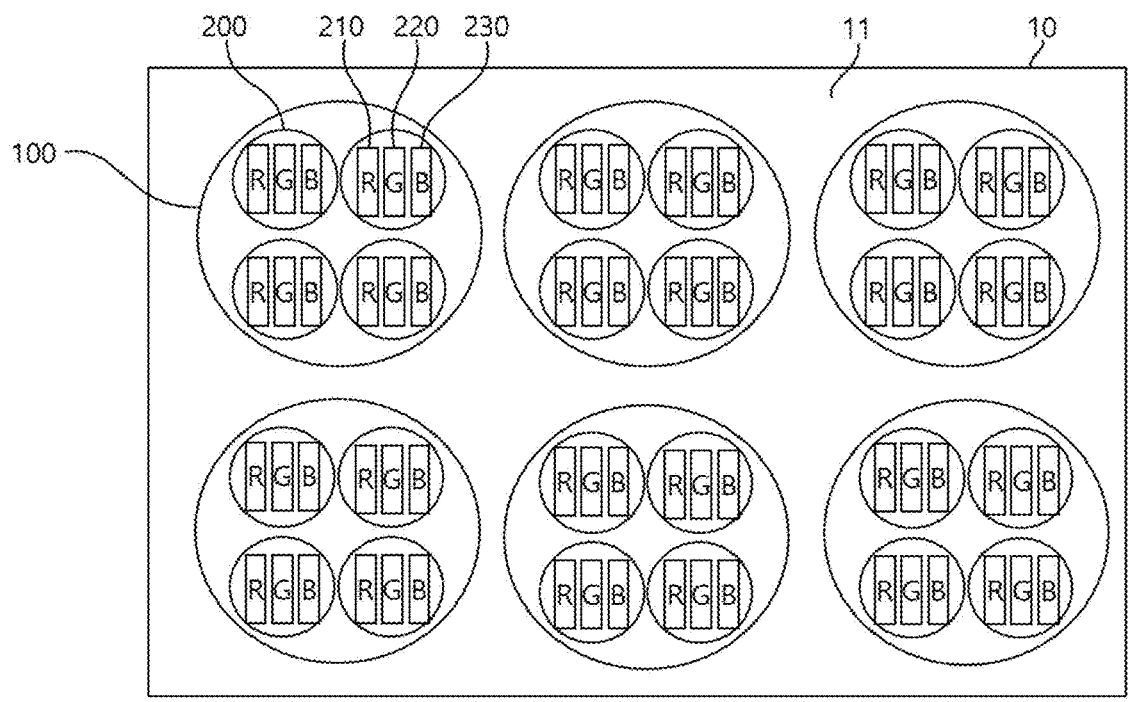

[FIG.3]
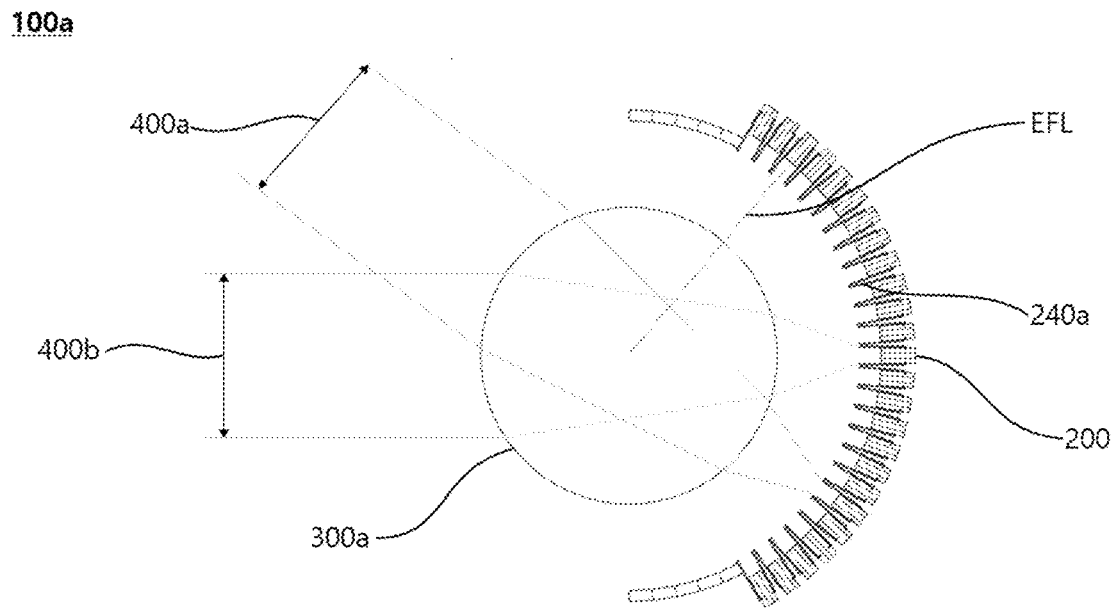
[FIG.4]
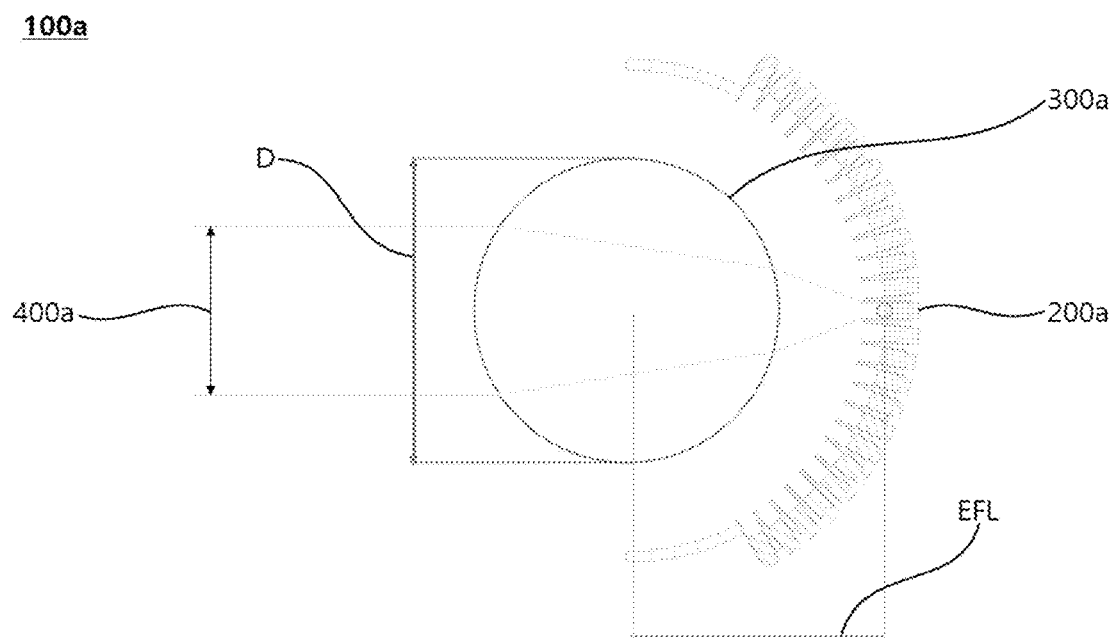

MULTI-ANGLE DISPLAY DEVICE CONTAINING LENS

TECHNICAL FIELD

The present disclosure relates to a multi-angle display device containing a lens, and more particularly, to a multi-angle display containing a lens capable of showing anamorphic 3D effects by preventing light coming from various viewing angles from spreading even with short light barriers per angle that are arranged to be spaced apart from a light source by a predetermined distance.

BACKGROUND

As the use of digital display billboards using anamorphic 3D effects as outdoor advertisement increases, interest in digital image processing systems using a digital information display (DID) is rapidly increasing.

Conventionally, a single-viewing-angle anamorphic display is used, but due to the anamorphic image being available from only one particular viewing angle, there is a problem that a proper 3D effect may be obtained only when a display is viewed from a specific angle and position for the 3D effect. In addition, when traditional light sources are arranged and used for displays, a full 3D effect cannot be obtained because light spreads due to the nature of the light source.

As a related patent, there is Patent No. 10-0618456 (stereoscopic display system using a lens array), but only a lens array having a curvature and separate from the light sources is disclosed.

SUMMARY

In view of the above, the present disclosure provides a multi-angle display device containing a lens that is arranged to be spaced apart from a unit pixel so that light coming from a light source does not spread and has a straight path, thus giving off different color information per given angle.

According to embodiments of the present disclosure, a multi-angle display device containing a lens includes a display panel having a plurality of unit pixels disposed therein; a data driving circuit including a plurality of source drive ICs to drive data lines of the display panel; a gate driving circuit including one or more gate driving ICs to sequentially supply scan pulses to gate lines of the display panel; a timing controller receiving a plurality of timing signals from an external system and generating control signals for controlling operation timings of the data driving circuit and the gate driving circuit; and a lens arranged to be spaced apart from the unit pixel by a predetermined distance, in which the unit pixel includes a plurality of light sources.

A plurality of light sources constituting the unit pixel may surround the lens at a predetermined angle, and the lens may be a spherical lens. Each of the plurality of light sources constituting the unit pixel may have a barrier disposed on the outside. Each of the plurality of light sources constituting the unit pixel may be located at an effective focal length from a center of the lens.

A plurality of light sources constituting the unit pixel may be configured in a planar shape, and the lens may be a conoscopic lens. A barrier may be disposed between the plurality of light sources constituting the unit pixel and the conoscopic lens.

According to the present disclosure, it is possible to implement a 3D effect in all types of displays regardless of the form or shape of the display, and observe the improved 3D effect from multiple viewing angles by arranging a lens to be spaced apart from a light source for each unit pixel so that light has a straight path without spreading. In addition, it is possible to shorten the lengths of the light barriers per angle disposed outside each light source by using a lens.

BRIEF DESCRIPTION OF THE DRAWINGS

FIG. 1 is a diagram schematically illustrating a multi-angle display device containing a lens according to an embodiment of the present disclosure.

FIG. 2 is a diagram illustrating a unit pixel and a light source structure of the multi-angle display device containing a lens according to the embodiment of the present disclosure.

FIGS. 3 and 4 are cross-sectional views of a unit pixel including a spherical lens according to an embodiment of the present disclosure.

DETAILED DESCRIPTION

Figure 5A:
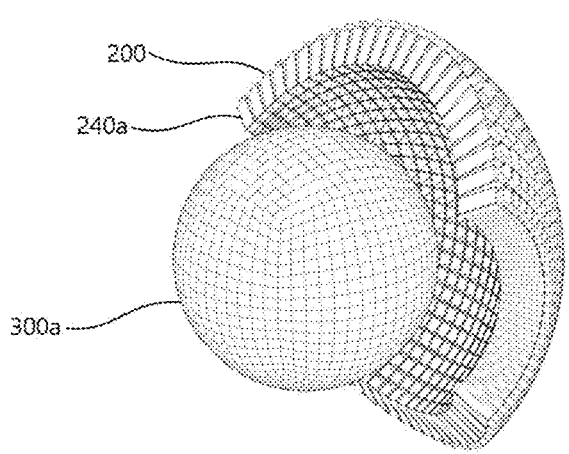
FIG. 5A is a perspective view of the unit pixel including the spherical lens according to the embodiment of the present disclosure.

Specific structural or functional descriptions disclosed in the present specification will be provided only in order to describe exemplary embodiments of the present disclosure. Therefore, exemplary embodiments of the present disclosure may be implemented in various forms, and the present disclosure is not to be interpreted as being limited to exemplary embodiments described in the present specification.

Since exemplary embodiments of the present disclosure may be variously modified and may have several forms, they will be shown in the accompanying drawings and be described in detail in the present specification. However, it is to be understood that exemplary embodiments of the present disclosure are not limited to specific forms, but includes all modifications, equivalents, and substitutions included in the spirit and the scope of the present disclosure.

Terms used in the present specification are used only in order to describe specific embodiments rather than limiting the present disclosure. Singular forms are intended to include plural forms unless the context clearly indicates otherwise. It is to be understood that terms "include", "have", or the like, used in the present specification specify the presence of features, numerals, steps, operations, components, parts, or a combination thereof stated in the present specification, but do not preclude the presence or addition of one or more other features, numerals, steps, operations, components, parts, or a combination thereof.

Hereinafter, exemplary embodiments of the present disclosure will be described in detail with reference to the accompanying drawings.

FIG. 1 is a diagram schematically illustrating a multi-angle display device according to an embodiment of the present disclosure. Referring to FIG. 1, a multi-angle display device containing a lens according to an embodiment of the present disclosure includes a display panel 10, a data driving circuit 20, a gate driving circuit 30, and a timing controller 40.

The display panel 10 may be implemented as a light emitting diode panel. However, it goes without saying that the display panel to which the present disclosure is applied may also be implemented as an organic light emitting diode panel, a liquid crystal display panel, a plasma display panel, or an electrophoretic display panel.

A plurality of unit pixels 100 may be formed in the display panel 10. Each of the unit pixels includes a plurality of light sources 200 and may be configured as described below, and the plurality of light sources may include a plurality of sub-pixels each expressing a specific color. At least one data line DL and at least one gate line GL may each be allocated to each unit pixel 100. A red subpixel 210 includes a red light emitting layer, a green subpixel 220 includes a green light emitting layer, and a blue subpixel 230 includes a blue light emitting layer. The unit pixel 100 may further include a first electrode (e.g., a cathode) stacked on top of each light emitting layer and a second electrode (e.g., anode) stacked on a lower portion of the light emitting layer, and may emit light in a top emission method. The light emitting layer emits light by a driving current applied from a TFT array via the second electrode. An opening means an area in which light generated from the light emitting layer is displayed as an image by a light source.

The data driving circuit 20 includes a plurality of source drive ICs (source integrated circuits) to drive data lines DLs of the display panel 10. The data driving circuit 20 converts the input digital video data into a data voltage under the control of the timing controller 40 and supplies the data voltage to the data lines DLs. The data voltage is applied to the TFT array through the data lines DLs to determine a driving current supplied from the driving element to the second electrode.

The gate driving circuit 30 includes one or more gate driving ICs to sequentially supply scan pulses (or gate pulses) to the gate lines GL of the display panel 10. In a gate in panel (GIP) method, the gate driving circuit 30 may include a shift resistor formed in the display panel 10.

The timing controller 40 receives a plurality of timing signals from an external system (not illustrated) and generates control signals for controlling operation timings of the data driving circuit 20 and the gate driving circuit 30. The timing controller 40 receives digital video data from the system and supplies the received digital video data to the data driving circuit 20.

FIG. 2 is a diagram illustrating a unit pixel 100 and a light source structure 200 of the multi-angle display device containing a lens according to the embodiment of the present disclosure.

Referring to FIG. 2, each of the light sources 200 includes a red sub-pixel 210, a green sub-pixel 220, and a blue sub-pixel 230 that are spaced apart from each other in parallel. Each of the red sub-pixel 210, the green sub-pixel 220, and the blue sub-pixel 230 is arranged in a stripe shape and is partitioned by a black region 11. The red light emitting layer 210, the green light emitting layer 220, and the blue light emitting layer 230 are each formed in a red light emitting layer, a green sub-pixel, and a blue light emitting layer. The present disclosure describes a structure arranged in a stripe form for convenience of description, but the arrangement structure of the sub-pixels is not limited. According to an embodiment, the arrangement structure of the sub-pixels may be a PenTile pixel, and the number of green pixels may be the same as the display resolution, while silver red or blue is only half of that. Also, as another example, a diamond PenTile pixel may have a sub-pixel structure rotated 45° from the PenTile pixel structure. The PenTile and the diamond Pentile may have a computationally maximum aperture ratio. In this two-pixel configuration, the spatial color resolution is half that of the green pixel resolution because the number of reds and blues is half that of green. Also, another example is Super AMOLED Plus, which has three color configurations in the light source. Also, as another example, there is a delta pixel (or a honeycomb pixel) having a triangular pixel, and the sub-pixel arrangements may have a honeycomb structure.

That is, the present disclosure may provide a multi-angle display device capable of rendering a digital 3D scene or shooting multiple angles to display a three-dimensional anamorphic projection on one display device, and projecting a clear image from various viewing angles.

The display device of the present disclosure includes pixels emitting different combinations of RGB light emitting devices from different angles. Each pixel includes pixel units emitting different RGB light combinations per individual angle. The number and positions of light emitting devices in each pixel are not limited. The higher the number, the individual images may be provided from more viewing angles and thus the higher the angular resolution of the display device becomes.

FIGS. 3 and 4 are cross-sectional views of a unit pixel 100a including a spherical lens 300a according to an embodiment of the present disclosure. Referring to FIG. 3, the spherical lens 300a is disposed to be spaced apart from a plurality of light sources 200 constituting the unit pixel 100a by a predetermined distance.

The plurality of light sources 200 are spaced apart from each other with a barrier 240a disposed on the outside, respectively, and are disposed while radially extending with respect to the center of the spherical lens 300a. The barrier 240a is a wall structure with an open center, and is configured so that only one light source 200 may be viewed from any angle. The barrier 240a may be made of a non-reflective material. The barrier 240a may be implemented as a plurality of barriers 240a having different angles. The barrier 240a is spaced apart from each other at an angle of 5° from the center of the barrier, but is not limited thereto, and virtually any desired angle, but recommended within a range of 5° to 10°.

The spherical lens 300a may hold paths 400a and 400b of the light entering from the light source 200 of various viewing angles in a straight line without spreading by using the refraction of the lens even if the barrier 240a is not long. That is, by arranging a spherical lens 300a without installing a long barrier on the outside of each light source 200, it is possible to provide an improved 3D effect by maintaining the spread of the light of the light source 200 in specific individual directions.

Referring to FIG. 4, the spherical lens 300a is located at the effective focal length (EFL) from each light source 200 to make a light path 400a a straight path by using the refraction of the lens, and the effective focal length EFL varies according to the type of the spherical lens 300a. When the point light source 200a with the focal length is selected among the plurality of light sources 200, one light path 400a is generated. A distance between the point light source 200a and the spherical lens 300a for the light path 400a to have the straight path is called the effective focal length (EFL), and the effective focal length (EFL) is corrected by the focal length and the focal point. The effective focal length EFL is calculated by a refractive index n and a diameter D of the spherical lens 300a, and the Equation thereof is as follows.

$$EFL = \frac{nD}{4(n-1)} \quad \text{[Equation 1]}$$

In this case, the refractive index n may vary depending on the material of the spherical lens 300a, and the diameter D may vary depending on the size of the spherical lens 300a. In consideration of the calculated effective focal length EFL, the spherical lens 300a is disposed to be spaced apart from the light sources 200.

Figure 5B:
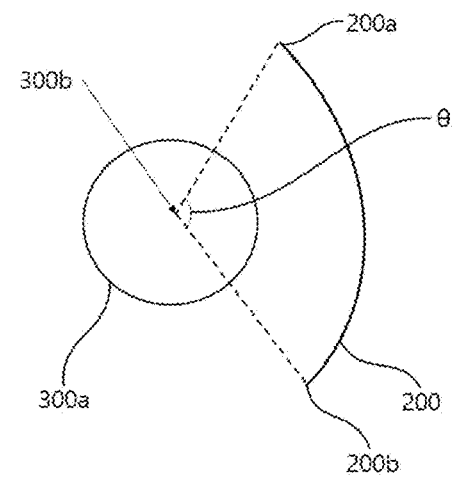
FIG. 5B is a perspective view of the unit pixel including the spherical lens according to the embodiment of the present disclosure.

Referring to FIG. 5A, the plurality of light sources 200 surround the spherical lens 300a at a predetermined angle é, and FIG. 5B illustrates a cross section of the spherical lens 300a and the plurality of light sources 200 arranged at a predetermined angle é. At this time, the angle é means an angle between a center 300b of the spherical lens 300a and the light sources 200a and 200b disposed at both ends of the light sources, and may have a maximum size of 180°. As the spherical lens 300a is additionally configured, the multi-angle display may exhibit an effective 3D effect even if the plurality of light sources 200 do not have a spherical or hemispherical shape.

Figure 6:
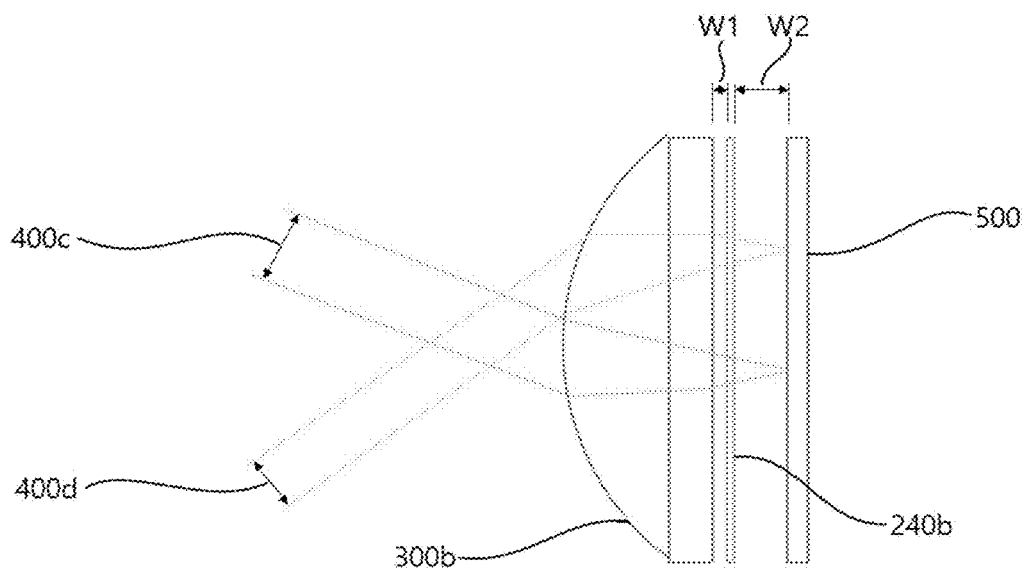
FIG. 6 is a perspective view of the unit pixel including the spherical lens according to another embodiment of the present disclosure.

FIG. 6 illustrates cross-sectional views of the unit pixel 100b including the conoscopic lens 300b according to another embodiment of the present disclosure. The unit pixel 100b using the conoscopic lens 300b uses the conoscopic lens 300b instead of the spherical lens 300a, and the plurality of light sources 200 are arranged in a 2D flat form instead of 3D to form a plate 500. The plate 500 and the conoscopic lens 300b are disposed to be spaced apart from each other with a barrier 240b disposed therebetween. A distance W1 between the conoscopic lens 300b and the barrier 240b and a distance W2 between the barrier 240b and the plate 500 are spaced apart in a ratio of about 1:3 to 1:5, which may vary depending on the type of the light source 200 constituting the plate 500 and the material of the barrier 240b. The barrier 240a is a wall structure with an open center, and is configured so that only one light source 200 may be viewed from any angle. The barrier 240a may be made of a non-reflective material.

The conoscopic lens 300b is a tool that may be used to measure an angular distribution of the light source, and allows light to proceed in straight paths 400c and 400d without spreading at different parts. Unlike the unit pixel 100a including the spherical lens 300a, since the unit pixel 100b including the conoscopic lens 300b has the light sources 200 in the form of the flat plate 500, the conoscopic lens 300b whose one side is flat may be used to change the light paths 400c and 400d to a straight path.

Figure 7A:
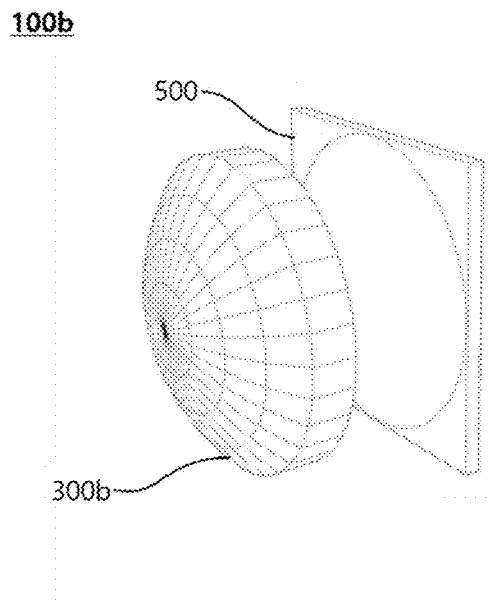
FIG. 7A is a perspective view of a unit pixel including a conoscopic lens and an exemplary diagram illustrating a distribution of a light source according to an embodiment of the present disclosure.
Figure 7B:
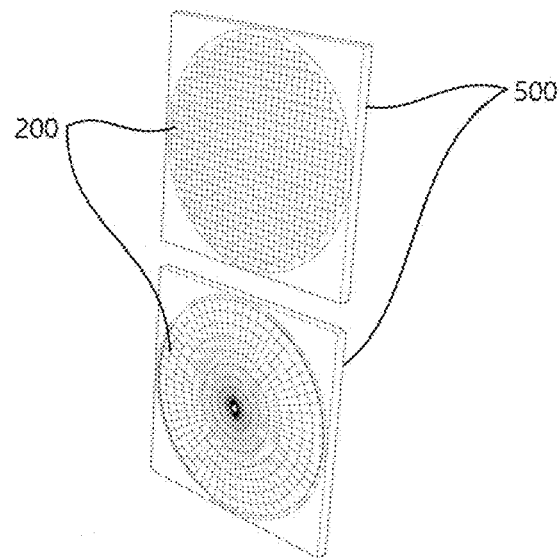
FIG. 7B is a perspective view of a unit pixel including a conoscopic lens and an exemplary diagram illustrating a distribution of a light source according to an embodiment of the present disclosure.

FIG. 7A illustrates the configuration of the conoscopic lens 300b and the plate 500, and FIG. 7B illustrates various arrangements of light sources in the form of the flat plate 500. In FIG. 7B, the light sources 200 are arranged in a grid shape and a radial shape according to the embodiment, but the present invention is not limited thereto, and when the light sources 200 may be arranged in a flat plate shape, the light sources 200 may have other structure.

Figure 8A:
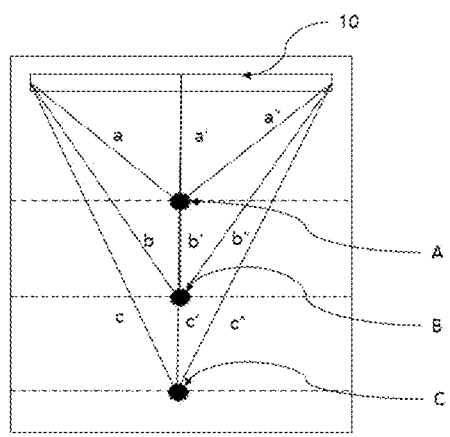
FIG. 8A is an exemplary diagram for explaining a solution showing a clear image without a certain distance to a display and a person (viewer) viewing the display according to an embodiment of the present disclosure.
Figure 8B:
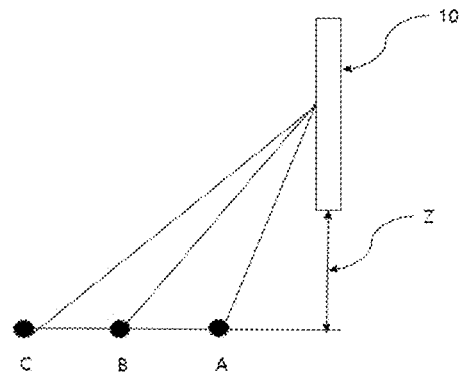
FIG. 8B is an exemplary diagram for explaining a solution showing a clear image without a certain distance to a display and a person (viewer) viewing the display according to an embodiment of the present disclosure

FIGS. 8A and 8B are diagrams according to an embodiment of the present disclosure, and is a diagram for explaining an example of a solution for showing a clear image without a predetermined distance from a display to a person (viewer) viewing the display.

Referring to FIG. 8A, when the viewer viewing the display is located at point A, a viewer may see a clear image only when a viewer sees the same image at any point on the display. In this case, assuming that the viewer at point A looks at both ends and the center of the display, the distances between the viewer and the display a, a', and a" all have the same vertical angles, a and b have different vertical angles, b" and c" have different vertical angles. That is, different planar angles for each vertical angle may be programmed through software. This works the same even if the viewer is located at point B and point C. When the viewer is at point B, b, b', and b" all have different vertical angles, and c, c', and c" are also the same. In addition, the display may be changed through programming so that the viewer may see a clear image even if the display is not separated from the floor and is positioned horizontally with the viewer. After all, when the screen is raised or lowered far enough above an eye level, the viewer may see clear images from anywhere without having to be at a certain distance.

Referring to FIG. 8B, the 3D effect is clear even if a length of Z, which means the height from the ground to the display, is different. The height of the viewer and the display does not necessarily have to be the same to see a clear image, and even if the distance between the viewer and the display is different, the image may be adjusted so that the image may be seen clearly at each angle of a pixel.

Although the present disclosure has been described with reference to exemplary embodiments shown in the accompanying drawings, it is only an example. It will be understood by those skilled in the art that various modifications and equivalent other exemplary embodiments are possible from the present disclosure. Accordingly, an actual technical protection scope of the present disclosure is to be defined by the following claims.

[Detailed Description of Main Elements]

| | | | |
|---|---|---|---|
| 10: | Display pane | 11: | Black area |
| 20: | Data driving circuit | 30: | Gate driving circuit |
| 40: | Timing controller | 100: | Display panel |
| 200: | Light source | 210: | Red subpixel |
| 220: | Green subpixel | 230: | Blue subpixel |
| 240: | Barrier | 300: | Lens |
| 400: | Path of light | 500: | Plat |

What is claimed is:

1. A multi-angle display device containing a lens, comprising:

a display panel having a plurality of unit pixels disposed therein;

a data driving circuit including a plurality of source drive integrated circuits (ICs) to drive data lines of the display panel;

a gate driving circuit including one or more gate driving ICs to sequentially supply scan pulses to gate lines of the display panel;

a timing controller receiving a plurality of timing signals from an external system and generating control signals for controlling operation timings of the data driving circuit and the gate driving circuit; and a lens arranged to be spaced apart from the unit pixel by a predetermined distance, wherein the unit pixel includes a plurality of light sources, wherein a plurality of light sources constituting the unit pixel surround the lens at a predetermined angle, and the lens is a spherical lens.

2. The multi-angle display device of claim 1, wherein each of the plurality of light sources constituting the unit pixel has a blocking wall disposed on the outside.

3. The multi-angle display device of claim 1, wherein each of the plurality of light sources constituting the unit pixel is located at an optimum focal length from a center of the lens, and the optimum focal length is calculated by the following equation:

$$EFL = \frac{nD}{4(n-1)}$$

4. The multi-angle display device of claim 1, wherein a plurality of light sources constituting the unit pixel is configured in a planar shape, and the lens is a conoscopic lens.

5. The multi-angle display device of claim 4, wherein a blocking wall is disposed between the plurality of light sources constituting the unit pixel and the conoscopic lens.

\* \* \* \* \*